United States Patent
Devereux

(10) Patent No.: US 9,075,402 B2
(45) Date of Patent: Jul. 7, 2015

(54) SYSTEM AND METHOD FOR MAPPING COMPONENT BASES USING A CHEMICAL PROCESS SIMULATOR

(75) Inventor: Brian M. Devereux, Elk Grove Village, IL (US)

(73) Assignee: Honeywell International Inc., Morristown, NJ (US)

( * ) Notice: Subject to any disclaimer, the term of this patent is extended or adjusted under 35 U.S.C. 154(b) by 355 days.

(21) Appl. No.: 13/043,353

(22) Filed: Mar. 8, 2011

(65) Prior Publication Data

US 2012/0232870 A1 Sep. 13, 2012

(51) Int. Cl.
G06G 7/57 (2006.01)
G06G 7/58 (2006.01)
G05B 17/02 (2006.01)
G06F 17/50 (2006.01)

(52) U.S. Cl.
CPC ............ *G05B 17/02* (2013.01); *G06F 17/5009* (2013.01)

(58) Field of Classification Search
USPC .......................................................... 703/12
See application file for complete search history.

(56) References Cited

U.S. PATENT DOCUMENTS

| 5,774,381 | A * | 6/1998 | Meier ................................ 703/2 |
| 5,818,736 | A | 10/1998 | Leibold |
| 6,212,488 | B1 | 4/2001 | Meier et al. |
| 6,442,513 | B1 * | 8/2002 | Cheng et al. .................... 703/12 |
| 2008/0109200 | A1 | 5/2008 | Bartee et al. |
| 2009/0089030 | A1 | 4/2009 | Sturrock et al. |
| 2010/0204925 | A1 | 8/2010 | Albahri |
| 2010/0222899 | A1 | 9/2010 | Blevins et al. |
| 2010/0262900 | A1 | 10/2010 | Romatier et al. |

OTHER PUBLICATIONS

Aspen Plus User Guide—Version 10.2, Aspen Technology Inc., Feb. 2000.*
Authors Unknown, HYSYS® 2004.2 : Operations Guide, Aspen Technology, Inc., Cambridge, MA, (2005), sections 1, 5, and 13.*
Authors Unknown, HYSYS® 2004.2 :Simulation Basis, Aspen Technology, Inc., Cambridge, MA, (2005), sections 4 and 6.*
Authors Unknown, HYSYS® 2004.2 :Simulation Basis, Aspen Technology, Inc., Cambridge, MA, (2005), Appendix A, 84 pages.*
Notification of Transmittal of the International Search Report and the Written Opinion of the International Searching Authority, or the Declaration dated Aug. 29, 2012 in connection with International Patent Application No. PCT/US2012/027689.

(Continued)

*Primary Examiner* — Omar Fernandez Rivas
*Assistant Examiner* — Robert Brock

(57) ABSTRACT

A method includes identifying a simulated input flow stream associated with a chemical processing facility. The input flow stream includes an input component basis with multiple components having one or more properties that differ. The method also includes converting the input flow stream into a simulated output flow stream, which includes an output component basis that differs from the input component basis and comprises a single, active group of oil components and zero or more pure components. A pure component property of a pure component in the input flow stream could be combined with an oil component property of an oil component in the input flow stream. A pure component property of a pure component in the input flow stream could also be transferred to a pure component in the output flow stream without combination. An oil component property of an oil component in the input flow stream could further be mapped to an oil component property of the single output oil component.

21 Claims, 3 Drawing Sheets

(56) References Cited

OTHER PUBLICATIONS

Notification of Transmittal of the International Search Report and the Written Opinion of the International Searching Authority, or the Declaration dated Aug. 31, 2012 in connection with International Patent Application No. PCT/US2012/027824.
"Creating a Reaction Engineering Process Model", www.engin.umich.edu, 2008, 9 pages.
"Conceptual design of chemical processes", Aspen Plus, www.spentech.com/core/aspen-plus.aspx, retrieved from the internet on Sep. 9, 2011, 3 pages.
"Conceptual design and performance improvement of processes", Aspen HYSYS, www.aspentech.com/products/aspen-hysys.aspx, retrieved from the Internet on Sep. 9, 2011, 2 pages.
"Honeywell's Simulation Solution-UniSim", http://hpsweb.honeywell.com/Cultures/en-US/Products/ControlApplications/simulation/defa . . . , retrieved from the internet on Sep. 9, 2011, 2 pages.
"Aspen HYSYS Upstream", www.aspentech.com/products/aspen-hysys-upstream.aspx, retrieved from the internet on Sep. 9, 2011, 2 pages.
"UniSim Design from Honeywell", http://hpsweb.honeywell.com/Cultures/en-US/Products/ControlApplications/simulation/Uni . . . , retrieved from the Internet on Sep. 9, 2011, 2 pages.
"Introduction to Flowsheet Simulation, Introduction to Aspen Plus", AspenTechnology, Inc., 2003, retrieved from the internet on Sep. 9, 2011, 4 pages.
"Aspen Tutorial#1: Aspen Basics", retrieved from the Internet on Sep. 9, 2011, 9 pages.
"Aspen Tutorial#2: Convergence and Presentation of Results", retrieved from the internet on Sep. 9, 2011, 10 pages.
"Aspen Tutorial#3: Flash Separation", retrieved from the internet on Sep. 9, 2011, 11 pages.
"Aspen Tutorial#4: Thermodynamic Methods", retrieved from the internet on Sep. 9, 2011, 7 pages.
"Aspen Tutorial#5: Sensitivity Analysis and Transport Properties", retrieved from the internet on Sep. 9, 2011, 13 pages.
"Aspen Tutorial#6: Aspen Distillation", retrieved from the internet on Sep. 9, 2011, 17 pages.

\* cited by examiner

SYSTEM AND METHOD FOR MAPPING COMPONENT BASES USING A CHEMICAL PROCESS SIMULATOR

TECHNICAL FIELD

This disclosure is generally directed to simulation tools. More specifically, this disclosure is directed to a system and method for mapping component bases using a chemical process simulator.

BACKGROUND

Simulation tools have often been used to model the behavior of industrial processes. In many cases, these simulation tools can reduce the efforts needed to develop representative process models. Chemical process simulators are a particular type of simulation tool that model the behavior of chemical processes, such as those chemical processes in a chemical processing plant.

SUMMARY

This disclosure provides a system and method for mapping component bases using a chemical process simulator.

In a first embodiment, a method includes identifying a simulated input flow stream associated with a chemical processing facility. The input flow stream includes an input component basis with multiple components having one or more properties that differ. The method also includes converting the input flow stream into a simulated output flow stream, which includes an output component basis that differs from the input flow stream and contains a single, active group of oil components and zero or more pure components.

In a second embodiment, an apparatus includes at least one memory unit configured to store information defining a simulated input flow stream associated with a chemical processing facility. The input flow stream includes an input component basis with multiple components having one or more properties that differ. The apparatus also includes at least one processing unit configured to convert the input flow stream into a simulated output flow stream, which includes an output component basis that differs from the input flow stream and contains a single, active group of oil components and zero or more pure components.

In a third embodiment, a computer readable medium embodies a computer program. The computer program includes computer readable program code for identifying a simulated input flow stream associated with a chemical processing facility. The input flow stream includes an input component basis with multiple components having one or more properties that differ. The computer program also includes computer readable program code for converting the input flow stream into a simulated output flow stream, which includes an output component basis that differs from the input flow stream and contains a single, active group of oil components and zero or more pure components.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
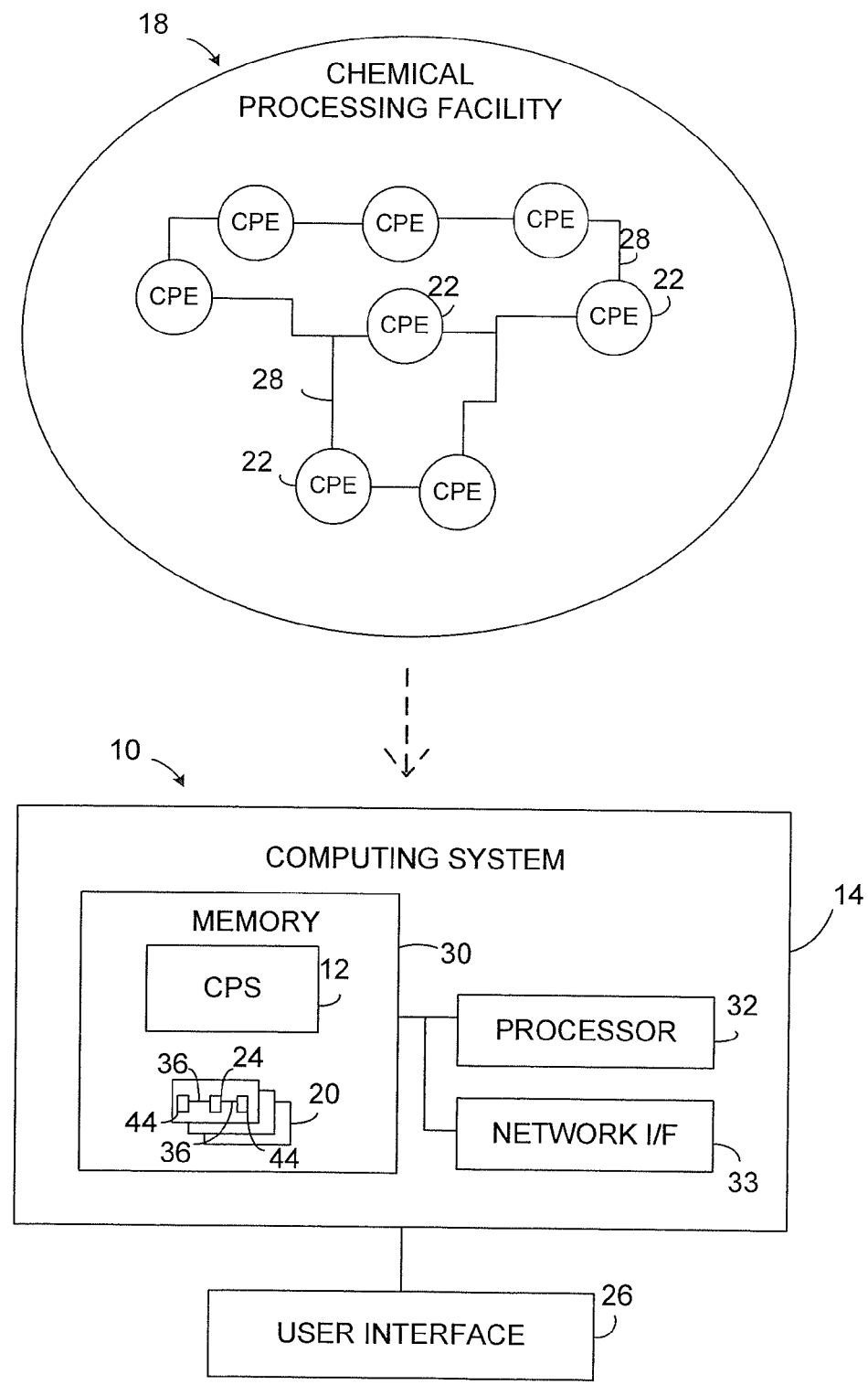
FIG. 1 illustrates an example process modeling system according to this disclosure.

FIG. 1 illustrates an example process modeling system 10 according to this disclosure. As shown in FIG. 1, the process modeling system 10 includes a chemical process simulator (CPS) 12, which simulates operation of a chemical processing facility 18. The chemical processing facility 18 may be any type of industrial facility (or portion thereof) that produces a chemical product from one or more constituent chemical ingredients or that otherwise processes chemical products. Examples of chemical processing facilities that may be simulated by the chemical process simulator 12 include oil or gas refineries, desalination plants, mineral refineries, wastewater treatment plants, power generation plants, and the like. The chemical processing facility 18 includes multiple chemical processing elements 22, each of which processes one or more chemical products in some specified manner. Examples of chemical processing elements 22 include heaters, holding tanks, valves, catalytic converters, mixers, separators, reactors, compressors, pumps, expanders, distillation units, surge tanks, accumulators, relief valves, absorbers, filters, and heat exchangers (including cross-flow exchangers, plate-fin exchangers, and shell-tube exchangers).

Each chemical processing element 22 performs some desired function involving one or more chemical ingredients or other products. For example, a particular chemical processing facility 18 may include a cracking device that breaks apart and separates a constituent chemical ingredient into its individual components. The cracking device may be connected to other elements, such as accumulators, heat exchangers, or dryers, that function together to produce a desired chemical product.

In many cases, a typical chemical processing facility 18 may be adapted to produce several different types of chemical products. For example, a particular chemical processing facility 18 may be adapted to produce several different types of ethylene-based products, such as ethylene glycol, polyethylene, polystyrene, and/or various derivatives thereof. The production of each product may be performed by a subset of the chemical processing elements 22 in the chemical processing facility 18. Also, operations associated with production of certain chemical products performed by the chemical processing elements 22 may be mutually exclusive to operations associated with production of other chemical products. For instance, certain chemical processing elements 22 may be used to produce only one chemical product at a time, while other chemical processing elements 22 could be used to produce different chemical products at a given time.

Conventional chemical process simulators used for simulations, such as oil refinery simulations, model constituent chemicals of a chemical process using components that may be categorized in at least two classes, namely pure components and oil components. Pure components generally represent one specific chemical species having a unique chemical formula (or elemental composition). For example, chemical species such as water, ammonia, or methane may be modeled as pure components. Examples of oil refinery processes that may be modeled by conventional chemical process simulators using pure components may include naphtha reforming processes, light paraffin isomerization processes, and isobutane alkylation processes. Conversely, oil components represent chemical mixtures having a complex composition that is often unknown and possibly containing numerous differing types of chemical species. In some embodiments, an oil component may be represented as a boiling range cut, using a single "virtual" component that represents the mixture of (possibly unknown) chemical species with normal boiling points in a specified range. An oil component represented in this fashion may also be referred to as a "narrow fraction". While intrinsic component properties of a pure component such as standard density or molecular weight are constants that do not vary across a conversion operation or chemical reactor, the corresponding properties of an oil component represented as a boiling range cut typically will be modified by a conversion process. In particular, oil components in the input flow stream to a reactor may have properties different from the oil components in the outlet flow stream outputted from the reactor. Examples of oil refinery processes that may be modeled by conventional chemical process simulators using oil components may include fluid catalytic cracking (FCC) processes, hydrocracking processes, hydrotreating processes, or coker (visbreaker) processes.

In some cases, it may be difficult to integrate various models to construct multi-unit simulations in which pure component processes are simulated along with oil component processes. This difficulty may be due, in large part, to incompatibility of oil components with pure components modeled by conventional chemical process simulators. Whereas oil components may be represented by properties such as boiling range cuts, pure components include properties that remain generally fixed. That is, simulation of oil components may be relatively difficult to model through multiple chemical processing elements 22 that may alter their chemical composition in such a manner to preclude their integration with pure components in a meaningful manner.

Although the properties of an oil component may be recalculated dynamically as a simulation progresses, an oil component is often limited to one set of properties at any stage of the simulation. In many cases, this aspect may preclude the recycling of oil-based flow streams with a single group of oil components. One solution to this problem has been to use a component basis that contains multiple groups of oil components that each span the same boiling range. These groups of oil components are referred to as an "oil group" and a flow stream may have a component basis that contains multiple oil groups. Each reactor operation in a particular chemical process may then include a dedicated oil group that it uses for its product components. The number of "oil groups" might then change dynamically as reactors are added or deleted.

As a particular example, a reactor chemical processing element 22 may define a product flow stream by calculating the composition and condition of the flow stream, as well as by updating the component properties of its associated oil group components. For instance, the molecular weight and specific gravity of the oil components can be updated and the remaining properties can be estimated by standard methods. Certain conventional chemical process simulators may represent oil property distributions via modifiable user properties. In this manner, changes in property distributions across a reactor may be accomplished by recalculating the component user properties for the reactor oil group to match the desired product property distributions.

As noted above, the chemical process simulator 12 simulates operation of the chemical processing facility 18. For example, the chemical process simulator 12 can receive one or more files 20 containing information associated with the chemical processing facility 18. Each file 20 may include multiple simulated processing elements 44, which represent the actual chemical processing elements 22 within the chemical processing facility 18. Each file 20 further includes one or more mapping elements 24 that may be used by the chemical process simulator 12 to convert an input flow stream 36 having an input component basis into an output flow stream 36 having an output component basis containing a single active group of oil components and zero or more pure components. The mapping element 24 will adjust the oil component properties of the outlet stream in order that the overall stream properties of the input and output streams are equal.

In this way, the chemical process simulator 12 uses the mapping elements 24 to convert input flow streams having an input component basis into output flow streams having an output component basis containing a single active group of oil components and zero or more pure components. Each of the output flow streams can have a single active group of oil components with properties that may be modeled with multiple sequential chemical processing elements 22. The component basis conversion may derive component properties for a single group of oil components in the outlet stream from multiple pure and oil components in the inlet stream so that the overall stream properties of a converted flow stream are preserved. Thus, chemical processes may be modeled using multiple chemical processing elements 22 that may each progressively modify the characteristics of a constituent chemical formulation. Additional details regarding the operation of the chemical process simulator 12 are provided below.

The chemical process simulator 12 includes any suitable structure for converting an input flow stream having an input component basis into an output flow stream having an output component basis containing a single active group of oil components and zero or more pure components, where the output flow stream has overall stream properties that match the overall stream properties of the input flow stream. For example, the chemical process simulator 12 could be implemented using hardware only or a combination of hardware and software/firmware instructions. In this example, the chemical process simulator 12 is implemented using a computing system 14 that includes at least one memory unit 30, at least one processing unit 32, and at least one network interface 33. The at least one memory unit 30 includes any suitable volatile and/or non-volatile storage and retrieval device(s), such as a hard disk, an optical storage disc, RAM, or ROM. The at least one processing unit 32 includes any suitable processing structure(s), such as a microprocessor, microcontroller, digital signal processor, application specific integrated circuit, or field programmable gate array. The at least one network interface 33 includes any suitable structure(s) for communicating over one or more networks, such as a wired Ethernet interface or a wireless interface. This represents one specific way in which the chemical process simulator 12 can be implemented, and other implementations of the chemical process simulator 12 could be used.

When implemented using software and/or firmware, the chemical process simulator 12 may include any suitable program instructions that simulate one or more chemical processes. In some embodiments, the chemical process simulator 12 may be implemented using the UNISIM DESIGN SUITE from HONEYWELL INTERNATIONAL INC.

Data used, collected, or generated by the process modeling system 10 can be presented to one or more users via at least one user interface 26. The user interface 26 includes any suitable structure for providing information to a user and optionally receiving information from a user. For example, the user interface 26 could represent a desktop computer, laptop computer, dummy computer terminal, or other computing device. Often times, the user interface 26 is located in a control room for the chemical processing facility 18, although the user interface 26 could be positioned at any suitable location.

Although FIG. 1 illustrates one example of a process modeling system 10, various changes may be made to FIG. 1. For example, the system 10 could include any number of computing systems 14, user interfaces 26, and chemical processing facilities 18. Also, the functional division shown in FIG. 1 is for illustration only. Various components in FIG. 1 could be combined, further subdivided, or omitted and additional components could be added according to particular needs. For instance, the computing system 14 could be integrated into the user interface 26. In addition, the chemical processing facility 18 could have any suitable structure with any number and arrangement of chemical processing elements 22 and conduits 28.

Figure 2:
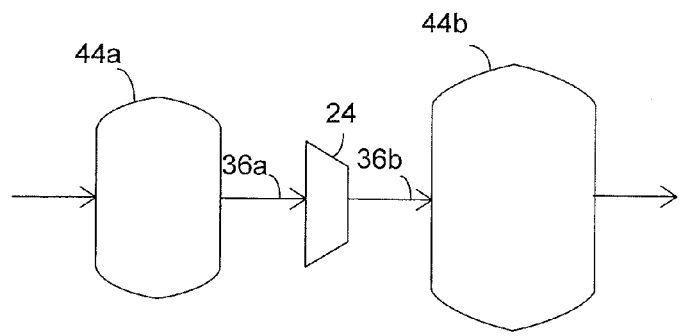
FIG. 2 illustrates an example use of a mapping element in the process modeling system of FIG. 1 according to this disclosure.

FIG. 2 illustrates an example use of a mapping element 24 in the process modeling system 10 of FIG. 1 according to this disclosure. As shown in FIG. 2, the mapping element 24 receives an input flow stream 36a, which in this particular example is received from a first simulated processing element 44a representing a first chemical processing element 22. The mapping element 24 also outputs an output flow stream 36b, which is transferred to a second simulated processing element 44b representing a second chemical processing element 22. Note, however, that the mapping element 24 could receive any number of input flow streams. When multiple input flow streams are used, the mapping element 24 may effectively function as a mixer in which constituent chemical formulations from all input flow streams are combined to form a single output flow stream.

The chemical process simulator 12 uses the mapping element 24 to convert the input flow stream 36a from an input component basis into the output flow stream 36b having an output component basis containing a single active group of oil components and zero or more pure components. In some embodiments, information defining the mapping element 24 and the simulated processing elements 44 may be stored in a file 20 in the memory 30, in which the mapping element 24 and/or the simulated processing elements are independently configurable with user-defined properties via the user interface 26.

As an example, the simulated processing element 44a may be a cracker that breaks apart crude oil to produce lighter hydrocarbons at the input flow stream 36a of the mapping element 24. The simulated processing element 44b may be another cracker that further breaks apart the output flow stream 36b of the mapping element 24 into other hydrocarbons. The chemical process simulator 12 uses the mapping element 24 to convert the input flow stream 36a into an output flow stream 36b that may be used by the simulated processing element 44b. This allows the chemical process simulator 12 to simulate a multi-unit process that models the behavior of multiple chemical processing elements 22 in a relatively accurate manner using different types and classes of constituent chemical formulations provided to the simulated processing element 44a.

The input flow stream 36a may include one or more pure components, one or more oil components, or any combination thereof. For example, the input flow stream 36a may include multiple pure components with no oil components, one or more pure components and one or more oil components, or multiple oil components and no pure components.

In some embodiments, the output flow stream 36b may also include one or more pure components in addition to the single, active group of oil components. For example, the input flow stream 36a may include certain well-identified, low molecular weight species which may be best simulated as pure components. Thus, the chemical process simulator 12 may transfer the properties of these pure components directly from the input flow stream 36a to the output flow stream 36b without converting them to their oil component equivalents. Examples of suitable chemical formulations may include hydrocarbons with less than six carbon atoms which are more naturally modeled as pure components. Thus, the output flow stream 36b may include a single active group of oil components and one or more pure components, which are fed to the input of the simulated processing element 44b.

The mapping element 24 may further convert an input flow stream 36a having a mixed component basis into an output flow stream 36b having a mixed component basis. A mixed component basis generally refers to a component basis that includes pure components and one or more groups of oil components. In some embodiments, the mapping element 24 may populate only a single group of oil components in its outlet flow stream 36b. In these embodiments, the mapping of the oil components can be performed in a relatively accurate manner, such as when the boiling ranges are compatible. The composition and component properties of the outlet flow stream 36b may be determined to preserve the distillation curve and property distributions relative to the input flow stream 36a. The component property distributions may be normalized to match the overall bulk stream properties between the input flow stream 36a and the output flow stream 36b.

The mapping element 24 may also convert an input flow stream 36a having a pure component basis into an output flow stream 36b having a mixed component basis. In certain cases, this particular situation may be reasonably well defined if a relatively good match exists for the pure components at the output flow stream 36b. Provided the pure components have been assigned the appropriate oil component properties, a distillation curve and property distributions can be calculated for the portion of the pure component input flow stream 36a that is to be mapped to the oil component basis. The oil composition and component properties can be chosen to match these curves. Normalization may be used to match bulk properties between the input flow stream 36a and the output flow stream 36b.

In this way, the chemical process simulator 12 can use the mapping element 24 to perform various conversion operations involving pure and oil components. This allows the chemical process simulator 12 to more effectively simulate the operation of the chemical processing facility 18.

Although FIG. 2 illustrates one example use of the mapping element 24 in the process modeling system 10 of FIG. 1, various changes may be made to FIG. 2. For example, the mapping element 24 can be customized to perform only the specific conversions required for a given use. Also, any number and arrangement of mapping elements 24 can be used in any given simulation. In addition, FIG. 2 represents a single example use of the mapping element 24. The mapping element 24 could be used in any other suitable manner.

Figure 3:
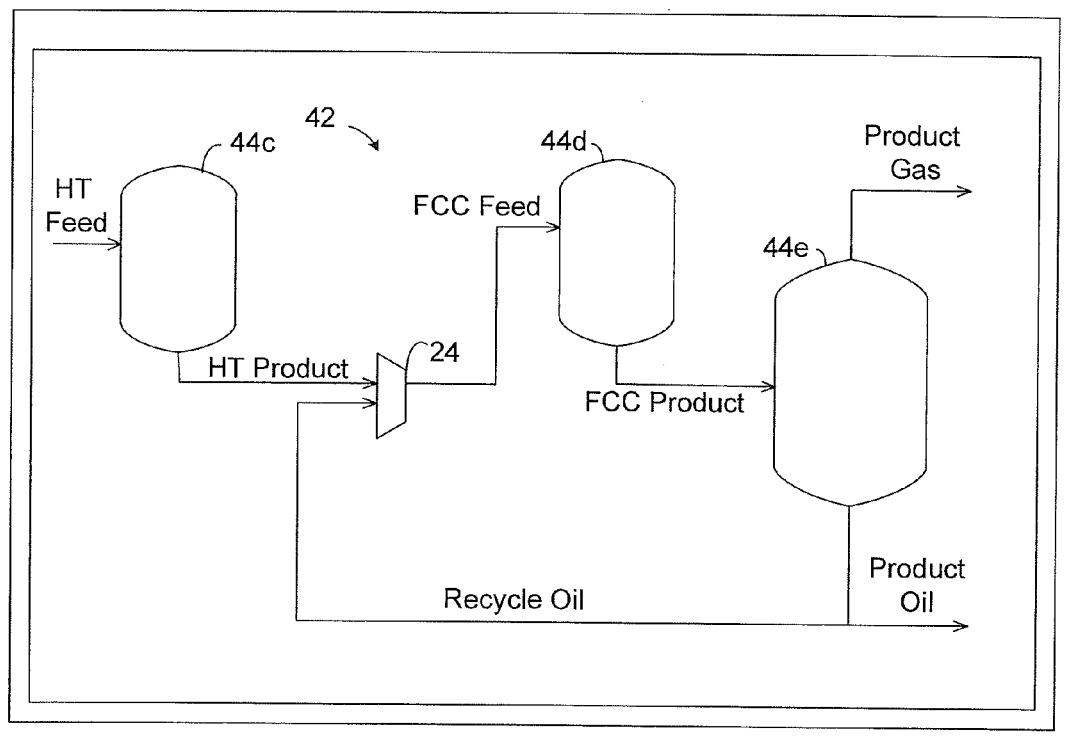
FIG. 3 illustrates an example process flow diagram (PFD) that may be displayed on a user interface and simulated by the process modeling system of FIG. 1 according to this disclosure.

FIG. 3 illustrates an example process flow diagram (PFD) 42 that may be displayed on a user interface and simulated by the process modeling system 10 of FIG. 1 according to this disclosure. In this example, the process flow diagram 42 includes a hydrotreater simulated processing element 44c, a fluid catalytic cracker simulated processing element 44d, a separator simulated processing element 44e, and a mapping element 24 connected as shown. The simulated processing elements 44c-44e represent chemical processing elements 22 of at least a portion of a chemical processing facility 18. The simulated processing element 44c receives a "HT Feed" flow stream and generates an "HT Product" flow stream. The simulated processing element 44d receives an "FCC Feed" flow stream and outputs an "FCC Product" flow stream. The simulated processing element 44e receives the "FCC Product" flow stream and generates "Product Gas," "Product Oil," and "Recycle Oil" flow streams. The mapping element 24 receives the "HT Product" flow stream and the "Recycle Oil" flow stream and outputs the "FCC Feed" flow stream. The "HT Product" flow stream and the "Recycle Oil" flow stream represent input flow streams of the mapping element 24, while the "FCC Feed" flow stream represents an output stream of the mapping element 24.

In this example, the mapping element 24 functions as a mixer and a component mapper in which the "HT Product" and "Recycle Oil" input streams are combined to form the single "FCC Feed" output stream. The three streams will each have a separate active group of oil components. The mapping element 24 will calculate the component flows and properties of the "FCC Feed" oil group to match the stream properties of the mixed "HT Product" and "Recycle Oil" input streams. The "FCC Feed" stream will then be available for simulation use by the processing element 44d.

Table 1 provides a summary of the relevant flow streams in the process flow diagram 42 and their respective pure components and oil components.

TABLE 1

| Flow stream Name | Pure Components | Oil Components |
| --- | --- | --- |
| HT Feed | up to 6 carbon number (C6-) | HT feed set |
| HT Product | up to 6 carbon number (C6-) | HT product set |
| FCC Feed | up to 5 carbon number (C5-) | FCC feed set |
| FCC Product | up to 5 carbon number (C5-) | FCC product set |
| Recycle Oil | up to 5 carbon number (C5-) | FCC product set |

The mapping of flow streams through the mapping element 24 may include several steps. First, the lighter pure components, such as those having carbon numbers up to five (C5-), may be directly mapped from their relevant input flow streams to the output flow stream (FCC Feed). If desired, mismatched pure components may be matched using fixed distributions.

Next, the C6 pure components from the "HT Product" inlet stream, may be mapped to oil components of the appropriate boiling range in the outlet stream "FCC Stream". Lastly, the oil components present in the inlet streams must be mapped to oil components in the outlet streams. The mass flow rates of the outlet oil components are calculated to match the distillation curve of the mixed inlet streams. The molecular weight and standard liquid densities of the outlet oil components are calculated to match the molecular weight and density distributions of the mixed inlet streams. Other component properties of the outlet oil components may be similarly calculated by matching the appropriate property distributions of the mixed inlet streams. The remaining desired properties of the oil components may be estimated using standard techniques and normalized as necessary to match the bulk stream properties.

Although FIG. 3 illustrates one example of a process flow diagram 42 that may be displayed on the user interface 26 and simulated by the process modeling system 10 of FIG. 1, various changes may be made to FIG. 3. For example, FIG. 3 represents a single example use of the mapping element 24. The mapping element 24 could be used in any other suitable manner.

Figure 4:
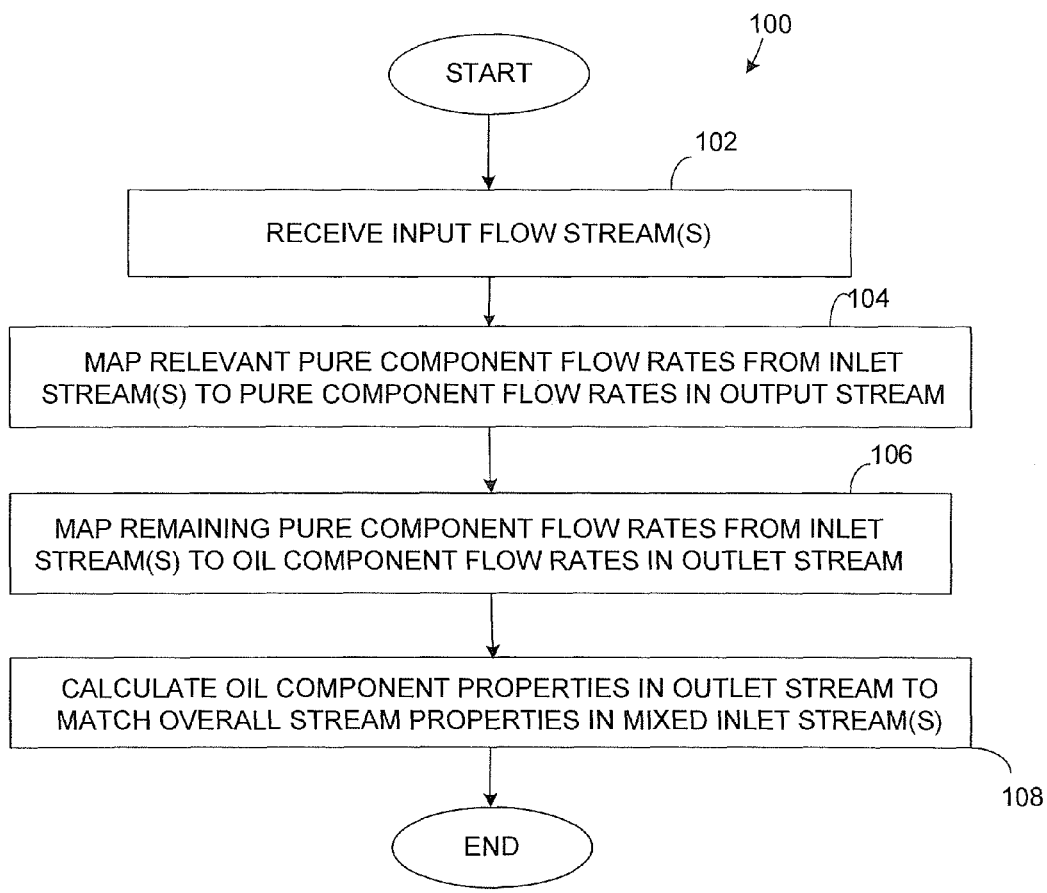
FIG. 4 illustrates an example method for mapping component bases using a chemical process simulator according to this disclosure.

FIG. 4 illustrates an example method 100 for mapping component bases using a chemical process simulator according to this disclosure. As shown in FIG. 4, a mapping element receives an input flow stream having a particular component basis at step 102. This may include, for example, the mapping element 24 receiving an input flow stream 36a having multiple pure components, one or more pure components and one or more groups of oil components, or one or more groups of oil components. The mapping element 24 could receive a single input flow stream or multiple input flow streams.

The chemical process simulator determines which pure components it can map from the input flow stream(s) to pure components in the outlet flow stream at step 104. In some embodiments, the mapping element 24 may include one or more user-selectable parameters that may be set by a user to specify the pure component mapping rules. Only the pure component flow rates are transferred from the inlet to outlet streams in which no properties are adjusted.

The chemical process simulator maps the remaining pure components from the input flow stream(s) to oil components in the outlet flow stream at step 106. The pure component is mapped to the oil component that spans the normal boiling point of the pure component. Only the pure component flow rates are transferred from the inlet to outlet streams in which no properties are adjusted. Only the pure component flow rates are transferred from the inlet to outlet streams. No properties are adjusted.

The chemical process simulator calculates the component properties of the oil components in the outlet stream to match the corresponding property curves of the mixed inlet stream(s) at step 108. This may include matching distillation curves to determine mass flows rates, matching molar flow rates to determine molecular weights, and matching ideal liquid volume flow rates to determine ideal liquid densities across the mapping element 24. In general, the component properties will be normalized to match the overall bulk stream properties of the mixed inlet stream(s).

In this way, regardless of the content of the input streams (only pure, pure and oil, or only oil components), the chemical process simulator 12 may use the mapping element 24 to map constituent input components to an output flow steam having a single oil component and one or more additional pure components. Steps 102-108 may also be repeatedly performed during simulation by the chemical process simulator 12 on the mapping element 24. As a particular example, simulations may be performed by iteratively adjusting certain input pure components to be mapped to the single oil component, while other input pure components are transferred to the output flow stream without being mapped.

Although FIG. 4 illustrates one example of a method 100 for mapping component bases using a chemical process simulator, various changes may be made to FIG. 4. For example, although described as using a single mapping element 24, any number of mapping elements 24 may be used during each simulation by the chemical process simulator 12.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of the invention, as defined by the following claims.

What is claimed is:

1. A method comprising:
receiving a simulated input flow stream associated with a chemical processing facility from one of multiple simulated processing elements, the input flow stream comprising an input component basis with multiple components having one or more properties that differ, the simulated processing elements representing multiple chemical processing elements within the chemical processing facility;
converting, using at least one processing device, the input flow stream into a simulated output flow stream having an output component basis that differs from the input component basis and that comprises a single, active group of oil components and one or more pure components;
displaying at least the output component basis; and
providing the output flow stream to another of the simulated processing elements,
wherein converting the input flow stream into the output flow stream includes:
transferring one or more pure component properties of one or more of a plurality of pure components in the input flow stream to the one or more pure components in the output flow stream without converting the one or more pure component properties of the one or more pure components in the input flow stream to one or more oil component equivalents;
mapping at least one other pure component in the plurality of pure components in the input flow stream to an oil component of the output flow stream that spans a boiling point of the at least one other pure component;
mapping one or more oil component properties of one or more oil components in the input flow stream to one or more oil component properties of the single, active group of oil components of the output component basis;
calculating properties of oil components in the output flow stream as properties of the single, active group of oil components, the oil components including at least the oil component mapped to the at least one other pure component; and
normalizing oil component properties in the output flow stream to match overall bulk stream properties of the output flow stream with overall bulk stream properties of the input flow stream;
wherein calculating the properties of the oil components in the output flow stream comprises:
calculating mass flow rates of the oil components in the output flow stream to match a distillation curve of one or more components in the input flow stream;
calculating oil component flow rates and properties of the oil components in the output flow stream to match corresponding property distributions of oil component properties of the input flow stream; and
calculating molecular weights and standard liquid densities of the oil components in the output flow stream to match molecular weights and density distributions of one or more components in the input flow stream.

2. The method of claim 1, wherein the input component basis comprises a mixed component basis having the plurality of pure components and one or more oil components.

3. The method of claim 1, wherein converting the input flow stream into the output flow stream further comprises:
generating and outputting a process flow diagram associated with the chemical processing facility, the process flow diagram comprising (I) the multiple simulated processing elements within the chemical processing facility and (ii) a mapping element configured to receive the input flow stream and generate the output flow stream.

4. The method of claim 1, wherein the input component basis comprises a mixed component basis having the plurality of pure components and a plurality of oil components.

5. The method of claim 1, wherein converting the input flow stream into the output flow stream further comprises:
using one or more user-selectable parameters to control a mapping of the components in the input flow stream to the components in the output flow stream.

6. The method of claim 5, wherein using the one or more user-selectable parameters includes using user-selectable parameters that specify pure component mapping rules.

7. The method of claim 1, wherein the simulated input flow stream comprises multiple input flow streams received from different ones of the simulated processing elements.

8. An apparatus comprising:
at least one memory device configured to store information defining a simulated input flow stream associated with a chemical processing facility, the input flow stream comprising an input component basis with multiple components having one or more properties that differ; and at least one processing device configured to:
  identify the simulated input flow stream by receiving the input flow stream from one of multiple simulated processing elements, the simulated processing elements representing multiple chemical processing elements within the chemical processing facility;
  convert the input flow stream into a simulated output flow stream having an output component basis that differs from the input component basis and that comprises a single, active group of oil components and one or more pure components; and
  provide the output flow stream to another of the simulated processing elements;
  wherein the at least one processing device is configured to convert the input flow stream into the output flow stream by:
    transferring one or more pure component properties of one or more of a plurality of pure components in the input flow stream to the one or more pure components in the output flow stream without converting the one or more pure component properties of the one or more pure components in the input flow stream to one or more oil component equivalents;
    mapping at least one other pure component in the plurality of pure components in the input flow stream to an oil component of the output flow stream that spans a boiling point of the at least one other pure component;
    mapping one or more oil component properties of one or more oil components in the input flow stream to one or more oil component properties of the single, active group of oil components of the output component basis;
    calculating properties of oil components in the output flow stream as properties of the single, active group of oil components, the oil components including at least the oil component mapped to the at least one other pure component; and
    normalizing oil component properties in the output flow stream to match overall bulk stream properties of the output flow stream with overall bulk stream properties of the input flow stream;
  wherein the at least one processing device is configured to calculate the properties of the oil components in the output flow stream by:
    calculating mass flow rates of the oil components in the output flow stream to match a distillation curve of one or more components in the input flow stream;
    calculating oil component flow rates and properties of the oil components in the output flow stream to match corresponding property distributions of oil component properties of the input flow stream; and
    calculating molecular weights and standard liquid densities of the oil components in the output flow stream to match molecular weights and density distributions of one or more components in the input flow stream.

9. The apparatus of claim 8, wherein the input component basis comprises a mixed component basis having the plurality of pure components and one or more oil components.

10. The apparatus of claim 8, wherein the at least one processing device is further configured to convert the input flow stream into the output flow stream by using one or more user-selectable parameters to control a mapping of the components in the input flow stream to the components in the output flow stream.

11. The apparatus of claim 10, wherein the at least one processing device is further configured to use the one or more user-selectable parameters by using user-selectable parameters that specify pure component mapping rules.

12. The apparatus of claim 8, wherein the input component basis comprises a mixed component basis having the plurality of pure components and a plurality of oil components.

13. The apparatus of claim 8, wherein the at least one processing device is further configured to generate and output a process flow diagram associated with the chemical processing facility, the process flow diagram comprising (i) multiple simulated processing elements within the chemical processing facility and (ii) a mapping element configured to receive the input flow stream and generate the output flow stream.

14. The apparatus of claim 8, wherein the simulated input flow stream comprises multiple input flow streams received from different ones of the simulated processing elements.

15. A non-transitory computer readable medium embodying a computer program, the computer program comprising computer readable program code for:
  receiving a simulated input flow stream associated with a chemical processing facility from one of multiple simulated processing elements, the input flow stream comprising an input component basis with multiple components having one or more properties that differ, the simulated processing elements representing multiple chemical processing elements within the chemical processing facility;
  converting the input flow stream into a simulated output flow stream having an output component basis that differs from the input component basis and that comprises a single, active group of oil components and one or more pure components; and
  providing the output flow stream to another of the simulated processing elements;
  wherein the computer readable program code for converting the input flow stream into the output flow stream includes computer readable program code for:
    transferring one or more pure component properties of one or more of a plurality of pure components in the input flow stream to the one or more pure components in the output flow stream without converting the one or more pure component properties of the one or more pure components in the input flow stream to one or more oil component equivalents;
    mapping at least one other pure component in the plurality of pure components in the input flow stream to an oil component of the output flow stream that spans a boiling point of the at least one other pure component;
    mapping one or more oil component properties of one or more oil components in the input flow stream to one or more oil component properties of the single, active group of oil components of the output component basis;
    calculating properties of oil components in the output flow stream as properties of the single, active group of oil components, the oil components including at least the oil component mapped to the at least one other pure component; and
    normalizing oil component properties in the output flow stream to match overall bulk stream properties of the output flow stream with overall bulk stream properties of the input flow stream;

wherein the computer readable program code for calculating the properties of the oil components in the output flow stream includes computer readable program code for:

calculating mass flow rates of the oil components in the output flow stream to match a distillation curve of one or more components in the input flow stream;

calculating oil component flow rates and properties of the oil components in the output flow stream to match corresponding property distributions of oil component properties of the input flow stream; and calculating molecular weights and standard liquid densities of the oil components in the output flow stream to match molecular weights and density distributions of one or more components in the input flow stream.

16. The non-transitory computer readable medium of claim 15, wherein the computer readable program code for converting the input flow stream into the output flow stream further comprises:

computer readable program code for generating and outputting a process flow diagram associated with the chemical processing facility, the process flow diagram comprising (i) multiple simulated processing elements within the chemical processing facility and (ii) a mapping element configured to receive the input flow stream and generate the output flow stream.

17. The non-transitory computer readable medium of claim 15, wherein the input component basis comprises a mixed component basis having the plurality of pure components and one or more oil components.

18. The non-transitory computer readable medium of claim 15, wherein the input component basis comprises a mixed component basis having the plurality of pure components and a plurality of oil components.

19. The non-transitory computer readable medium of claim 15, wherein the computer readable program code for converting the input flow stream into the output flow stream further comprises:

computer readable program code for using one or more user-selectable parameters to control a mapping of the components in the input flow stream to the components in the output flow stream.

20. The non-transitory computer readable medium of claim 19, wherein the computer readable program code for using the one or more user-selectable parameters includes computer readable program code for using user-selectable parameters that specify pure component mapping rules.

21. The non-transitory computer readable medium of claim 15, wherein the simulated input flow stream comprises multiple input flow streams received from different ones of the simulated processing elements.

\* \* \* \* \*